United States Patent
Tatekawa et al.

[11] Patent Number: 6,143,697
[45] Date of Patent: Nov. 7, 2000

[54] METHOD FOR PRODUCING SUPERCONDUCTING THICK FILM

[75] Inventors: Tsutomu Tatekawa, Otsu; Yuji Kintaka, Omihachiman; Akio Oota, Toyohashi, all of Japan

[73] Assignee: Murata Manufacturing Co., Ltd., Japan

[21] Appl. No.: 09/371,553

[22] Filed: Aug. 10, 1999

[30] Foreign Application Priority Data

Aug. 17, 1998 [JP] Japan .................................. 10-230570

[51] Int. Cl.$^7$ .................................................. H01L 39/24
[52] U.S. Cl. ........................ 505/491; 505/492; 505/471; 505/500; 505/501; 505/742
[58] Field of Search .................... 505/492, 491, 505/471, 500, 501, 432, 741; 427/62

[56] References Cited

U.S. PATENT DOCUMENTS 5,674,814 10/1997 Lanagan et al. .................... 505/491

FOREIGN PATENT DOCUMENTS 5-43341 2/1993 Japan .

OTHER PUBLICATIONS

"Critical Current Density and Microstructure of Screen–Printed $(Bi,Pb)_2Sr_2Ca_2Cu_3O_x$ Thick Film Sandwiched Between Ag Substrates"; A. Oota, et al.; Applied Physics Letters, U.S., American Institute of Physics, New York, vol. 63, No. 2, p. 243–245.

"Hetero Interfaces of Bi–based Superconductor/Insulator and Electrical Properties"; Sunao Sugihara, et al.; Proceedings of the 1997 4$^{th}$ International Symposium on Atomically Controlled Surfaces and Interfaces; ACSI–4; Tokyo; Japan; Oct. 27–30, 1997; vol. 130–132, pp. 866–869.

Database WPI; Section Ch, Week 198933; Derwent Publications Ltd., London, GB; Class L03, AN 1989–237607; XP002123568 & JP 01 172218 A (Nippon Kokan KK), Jul. 7, 1989.

Patent Abstracts of Japan; vol. 018, No. 046 (C–1157); Jan. 25, 1994 & JP 05 270826 A (Ishikawajima Harima Heavy Ind. Co., Ltd.); Oct. 19, 1993.

*Primary Examiner*—Roy V. King
*Attorney, Agent, or Firm*—Ostrolenk, Faber, Gerb & Soffen, LLP

[57] ABSTRACT

A method for producing a superconducting thick film involves the steps of forming a thick layer comprising a superconducting material on a substrate; firing the thick layer formed on the substrate; subjecting the fired thick layer to cold isostatic pressing; and refiring the thick layer subjected to cold isostatic pressing.

14 Claims, 5 Drawing Sheets

METHOD FOR PRODUCING SUPERCONDUCTING THICK FILM

BACKGROUND OF THE INVENTION

1. Field of the Invention

The present invention relates to a method for producing superconducting thick films, and more particularly, to a method for producing a superconducting thick film used, for example, for a dielectric resonator.

2. Description of the Related Art

Because of the recent rapid propagation of mobile communication, a shortage of radio-wave frequencies used for communication is anticipated in the near future. Therefore, in order to effectively use the limited frequencies, the development of a microwave filter used in base stations, having low loss and steep attenuation characteristics, has been desired. As such a filter, for example, a dielectric resonator is used. An example of such a dielectric resonator is a $TE_{011}$-mode dielectric resonator as shown in FIG. 1. The dielectric resonator 10 includes a copper plate 12. A dielectric 14 is placed on the copper plate 12. A substrate 18 provided with a superconducting film 16 is further placed on the dielectric 14. Therefore, the dielectric 14 is sandwiched between the copper plate 12 and the superconducting film 16. Excitation cables 20 and 22 are disposed so as to be opposed to each other on both sides of the dielectric 14 between the copper plate 12 and the superconducting film 16.

Another example is a $TM_{010}$-mode dielectric resonator as shown in FIG. 2. A dielectric resonator 10 includes a dielectric substrate 30 and superconducting films 32 and 34 formed on both sides of the dielectric substrate 30. The dielectric substrate 30 is fixed within a metallic case 38 with a Teflon sheet 36 therebetween. The metallic case 38 is provided with an excitation cable 40 on one end and an excitation cable 42 on another end.

Such a dielectric resonator 10 uses a phenomenon in which an electromagnetic wavelength is shortened to $1/(\epsilon r)^{1/2}$ (where $\epsilon r$ is the relative dielectric constant) in the dielectric in comparison with that in free-space, and is used in various resonant modes such as a TE mode, TM mode or TEM mode. In such a dielectric resonator 10, its unloaded Q (Qu) depends on both dielectric Q (Qd=1/tan δ) and Q (Qc) due to conductor loss resulting from an electric current on the surface of the metal, and Qu is expressed by the following equation:

$$1/Qu=(1/Qd)+(1/Qc)$$

Thus, in order to obtain a resonator having high unloaded Q (Qu), a dielectric material having high Qd as well as electrodes having high Qc, i.e., a low conductor loss, must be used. Accordingly, as shown in FIG. 1 or FIG. 2, superconducting films 18, 32 and 34, having smaller surface resistance than that of a conductive metal such as copper, are used, whereby conductor loss can be reduced. with respect to such superconducting films 18, 32 and 34, various investigations and developments have been made mainly on yttrium-based thin films.

However, in view of implementing the industrial use in the case of thin films, production costs are significantly high, and it is difficult to form thin films having large areas. On the other hand, in the case of thick films formed by screen-printing or the like, although production costs are significantly low in comparison with the thin film process and it is easy to form large areas, the surface resistance is large because the surface state and the grain orientation of thick films are inferior to thin films. In particular, with respect to a Bi-based 2223 phase which has a high critical temperature Tc (110° K) among oxide high temperature superconductors and the implementation of use of which is expected, the surface state deteriorates because flaky grains grow in a disorderly way, and improvement of the grain orientation and the surface state has been required.

SUMMARY OF THE INVENTION

To overcome the above described problems, preferred embodiments of the present invention provide a method for producing a superconducting thick film which has satisfactory grain orientation and surface state, and low surface resistance.

One preferred embodiment of the present invention provides a method for producing a superconducting thick film comprising the steps of: forming a thick layer comprising a superconducting material on a substrate; firing the thick layer formed on the substrate; subjecting the fired thick layer to cold isostatic pressing; and refiring the thick layer subjected to cold isostatic pressing.

The above described method may further comprise the step of repeating at least once the steps of subjecting the thick layer to cold isostatic pressing and of firing the thick layer after the step of refiring the thick layer is ended.

Preferably, the cold isostatic pressing is performed while a sheet having a release agent is placed between the thick layer and a jig plate in associated with the thick layer.

Preferably, the thick layer is a Bi-based 2223 phase.

In the above described method, the substrate may be a dielectric substrate. In this case, the substrate may be a dielectric substrate selected from the group consisting of an MgO substrate, a Ba(Sn, Mg, Ta)$O_3$-based substrate, and a Ba(Mg, Sb, Ta)$O_3$-based substrate. Alternatively, the substrate may be an Ag substrate.

By cold isostatic pressing, uniform pressure is applied to the substrate and to the surface of the thick film. By performing such cold isostatic pressing and firing, the surface roughness of the thick film is significantly improved, resulting in satisfactory surface state and grain orientation. Particularly in a superconducting thick film of the Bi-based 2223 phase, a satisfactory surface state is obtained.

In a TE $_{011}$-mode dielectric resonator, a dielectric is sandwiched between electrodes and in such a case, a silver substrate or a dielectric substrate may be used as the substrate for forming a superconducting thick film used as an electrode.

When both surfaces of the dielectric must be provided with a superconducting thick film, as in a $TM_{010}$-mode dielectric resonator, a dielectric substrate is used as a substrate.

When a dielectric substrate is used as the substrate, the dielectric substrate is preferably selected from the group consisting of an Mgo substrate, a Ba(Sn, Mg, Ta)$O_3$-based substrate and a Ba(Mg, Sb, Ta)$O_3$-based substrate.

Other features and advantages of the present invention will become apparent from the following description of the invention which refers to the accompanying drawings.

DESCRIPTION OF THE PREFERRED EMBODIMENTS

In order to obtain a superconducting thick film, superconducting material powder is prepared. The superconducting material powder and an organic vehicle are mixed. The resultant mixture is adjusted so as to have an appropriate viscosity and a thick film is formed on a substrate by screen-printing or the like. The resultant thick film is dried in an oven, organic components are removed, and then the substrate provided with the thick film is fired. There are no specific conditions with respect to the powder or vehicle or firing atmosphere. For example, firing may be performed in the air or in a mixed gases having different oxygen partial pressure.

After the substrate provided with the thick film is fired, cold isostatic pressing (CIP) is performed. Subsequent to CIP, the substrate provided with the thick film is fired again. After repeated CIP and firing, a superconducting thick film is formed. The pressure of CIP is preferably about 1,000 (kg/cm$^2$) or more. Additionally, after the superconducting material is screen-printed on the substrate, if CIP is performed before firing, film density is of course improved.

The reason for selecting CIP instead of general pressing as the pressing method is that uniform pressure is applied entirely and damage to the substrate or the superconducting thick film can be prevented during pressing. In particular, when a dielectric substrate is used as a substrate, cracking may occur on the substrate during pressing, resulting in a serious problem, and thus the advantage of CIP is obvious.

Figure 1:
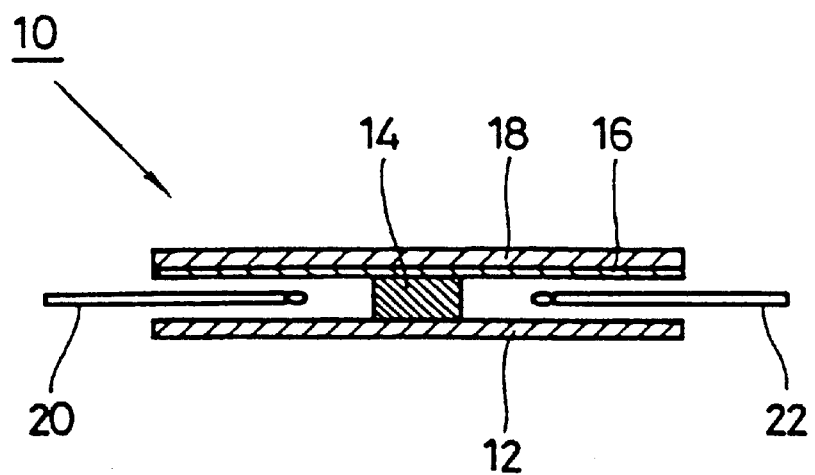
FIG. 1 is a schematic diagram showing a conventional $TE_{011}$-mode dielectric resonator.
Figure 3:
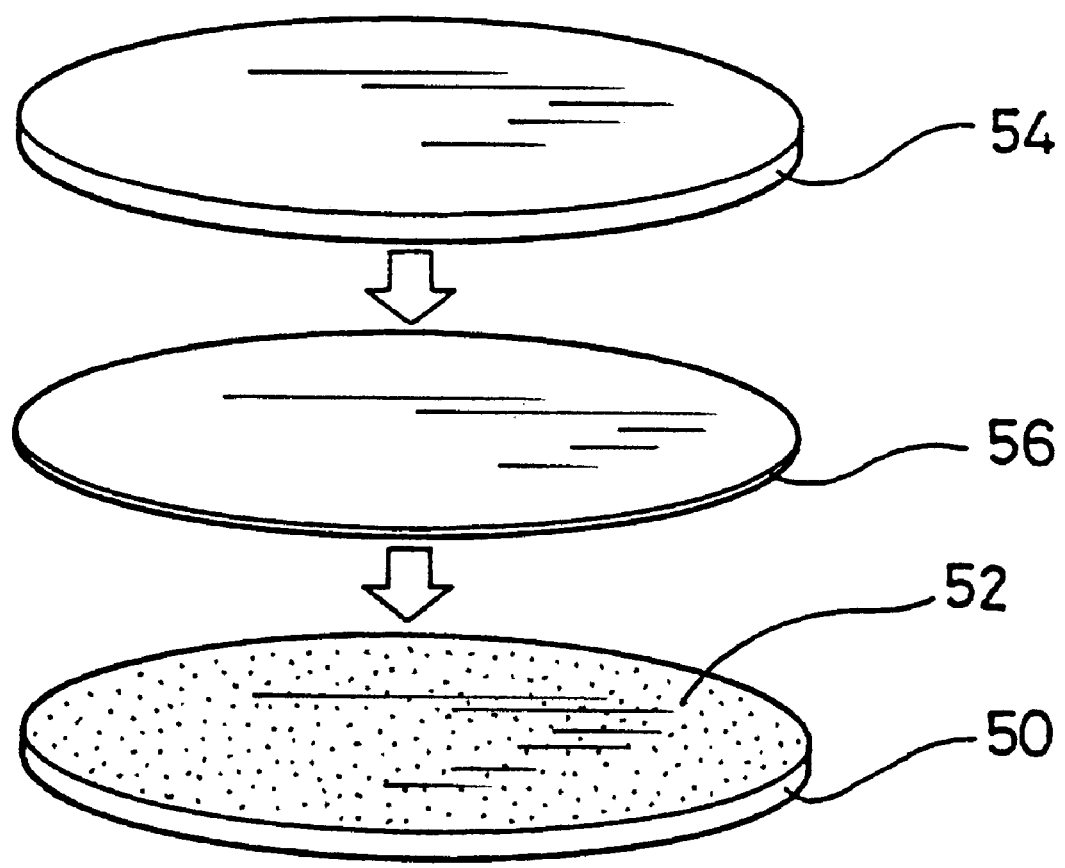
FIG. 3 is a schematic diagram which shows steps in a method for producing superconducting thick films in one preferred embodiment of the present invention.

When a superconducting thick film used for a TE$_{011}$-mode dielectric resonator as shown in FIG. 1 is produced, as shown in FIG. 3, a thick film 52 is formed on a substrate 50, a jig plate 54 is placed on the thick film 52, and the thick film 52 is sandwiched between the substrate 50 and the jig plate 54. They are then vacuum sealed in a rubber case, a vinyl bag, or the like, and CIP is performed. Although any material such as a metal, resin, or ceramic may be used as the jig plate 54, preferably the surface thereof is mirror finished. Additionally, as shown in FIG. 1, if a sheet 56 a release agent is sandwiched between the jig plate 54 and the thick film 52, damage to the superconducting film can be reduced. As the substrate 50, an Ag substrate or dielectric substrate may be used.

Figure 2:
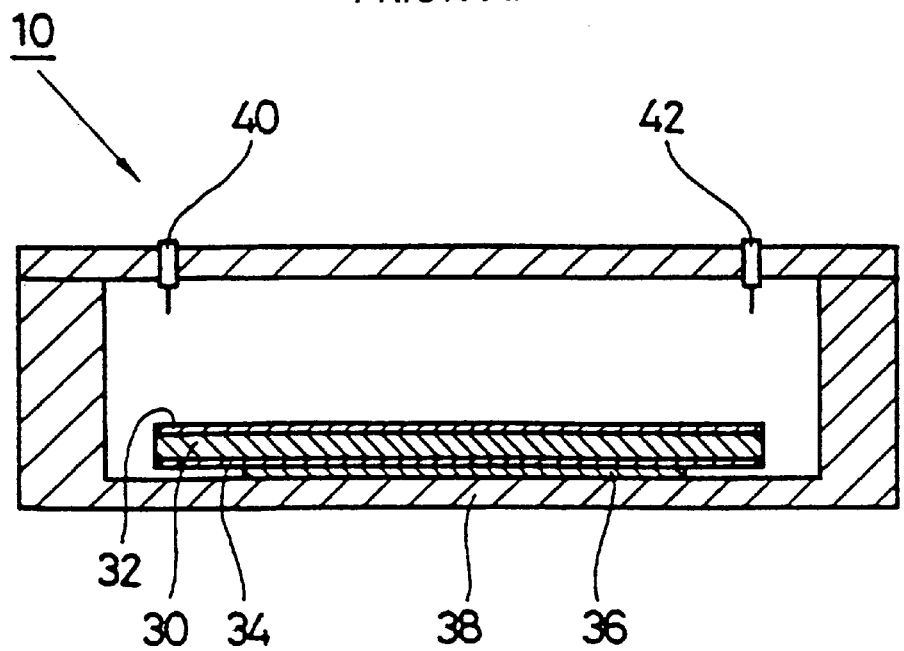
FIG. 2 is a schematic diagram showing a conventional $TM_{010}$-mode dielectric resonator.
Figure 4:
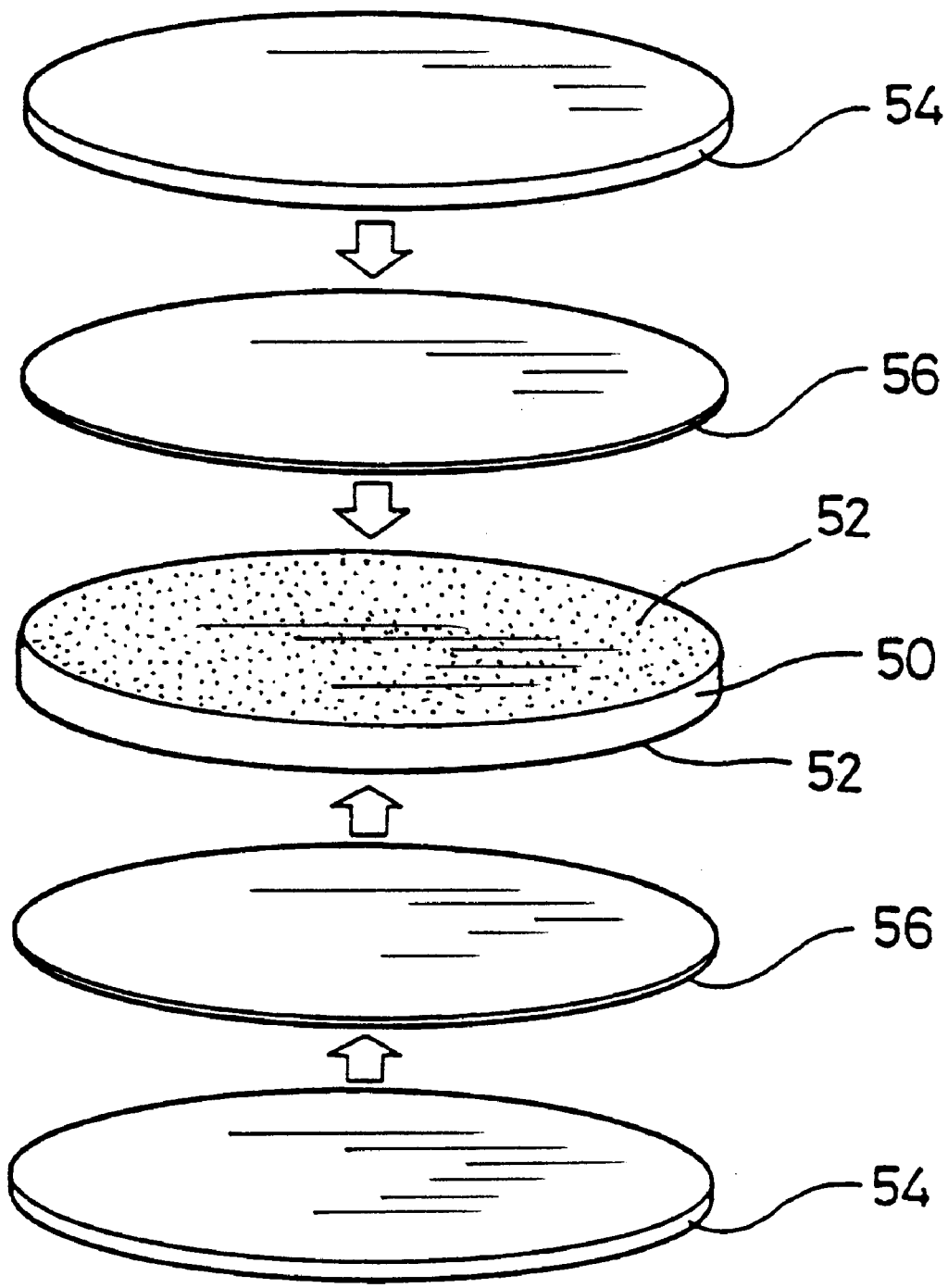
FIG. 4 is a schematic diagram which shows steps when superconducting thick films are formed on both sides of a substrate.

In the case of a superconducting thick film used for a TM$_{010}$-mode dielectric resonator as shown in FIG. 2, as shown in FIG. 4, thick films 52 are formed on both sides of a substrate 50, and jig plates 54 are placed on both thick films 52 with sheets 56 therebetween. In such a state, the substrate 50 provided with thick films 52 is pressed by CIP. A dielectric substrate must be used in such a case, as the substrate 50, and for example, a dielectric substrate selected from the group consisting of an MgO substrate, a Ba(Sn, Mg, Ta)O$_3$-based substrate, and a Ba(Mg, Sb, Ta)O$_3$-based substrate is used.

In the method described above, the surface roughness of a superconducting thick film is significantly improved by repeating CIP and firing, and consequently, the surface resistance is also decreased. Therefore, by using a superconducting thick film formed by such a method for a dielectric resonator, a resonator having high unloaded Q can be obtained.

EXAMPLE

Powder having a composition of a Bi-based 2223 phase and an organic vehicle were mixed, and the resultant mixture was adjusted so as to have an appropriate viscosity, and then was screen-printed on an MgO ceramic substrate to obtain a thick film. The resultant thick film was dried in an oven at 100 to 150° C., and organic components were removed at 300 to 400° C., and then firing was performed at 840 to 860° C. After the substrate provided with the thick film was fired, in the method shown in FIG. 3, CIP was performed at a pressure of 2,000 kg/cm$^2$. The substrate provided with the thick film was then fired again under the conditions described above. Such CIP and firing were repeated again in some instances. In such a method, a plurality of thick films were formed under different conditions of firing and pressing shown in Table 1. In Table 1, sample Nos. 1 to 3 are out of the range of the present invention, and sample Nos. 4 to 7 are within the range of the present invention.

TABLE 1

| Sample No. | 1 | 2 | 3 | 4 | 5 | 6 | 7 |
|---|---|---|---|---|---|---|---|
| Firing temperature (° C.) | 850 | 850 | 850 | 850 | 850 | 850 | 850 |
| First firing time (hour) | 100 | 200 | 250 | 50 | 50 | 50 | 50 |
| From second onward firing time (hour) | 0 | 0 | 0 | 50 × 1 | 50 × 2 | 50 × 3 | 150 × 1 |
| Cycle(times) | 0 | 0 | 0 | 1 | 2 | 3 | 1 |
| Surface roughness Ra(μm) | 0.8 | 0.9 | 0.9 | 0.6 | 0.4 | 0.4 | 0.5 |
| Surface resistance Rs(20 K) (mΩ) | 6.1 | 5.7 | 6.0 | 3.5 | 1.1 | 1.0 | 3.1 |
| Surface resistance Rs(70 K) (mΩ) | 57.8 | 13.4 | 14.5 | 50.1 | 6.1 | 5.6 | 8.6 |

In Table 1, "First firing time" indicates firing time in which firing was performed for the first time after a thick film had been formed on a substrate by screen-printing. "From second onward firing time" indicates firing time in which firing was performed again after first firing and first pressing had been performed. Herein, from second onward firing time as well as the number of firings are shown. "Cycle" indicates the number of cycles, where each cycle consists of a pressing step and a firing step. Therefore, the number of firings in the "from second onward firing time" agrees with the value in the "Cycle" row. "Surface resistance" indicates the surface resistance of a thick film formed, and the surface resistances at absolute temperatures of 20° K and 70° K are shown.

The measurement of the surface resistance was carried out by a dielectric resonator method (Hakki & Colemann) using a dielectric resonator having a structure shown in FIG. 1. The dielectric resonator method is generally used as a method for evaluating dielectric characteristics of a dielectric material within the microwave band, and also as a method for measuring surface resistance of a superconductor. In FIG. 1, the dielectric 14 is composed of a Ba(Sn, Mg, Ta)$O_3$-based material, and in the measuring temperature region, the relative dielectric constant ∈r and the dielectric loss tangent tan δ thereof are already known. The dielectric 14 has a diameter of 8.5 mm, a thickness of 3.8 mm, and a resonant frequency $f_o$ of 10.7 GHz.

Figure 5:
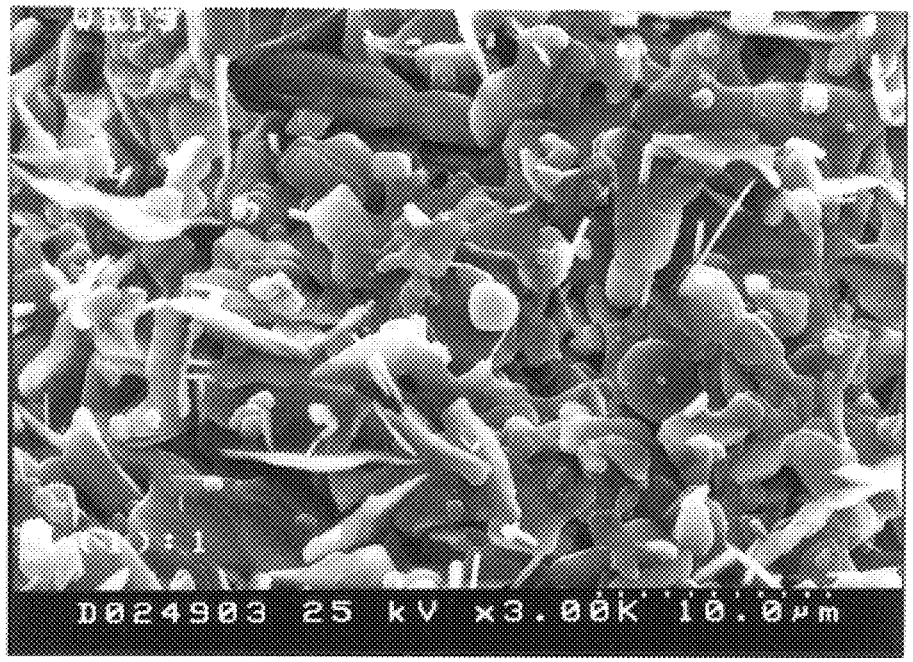
FIG. 5 shows the surface of a thick film in sample No. 3 in Table 1.
Figure 6:
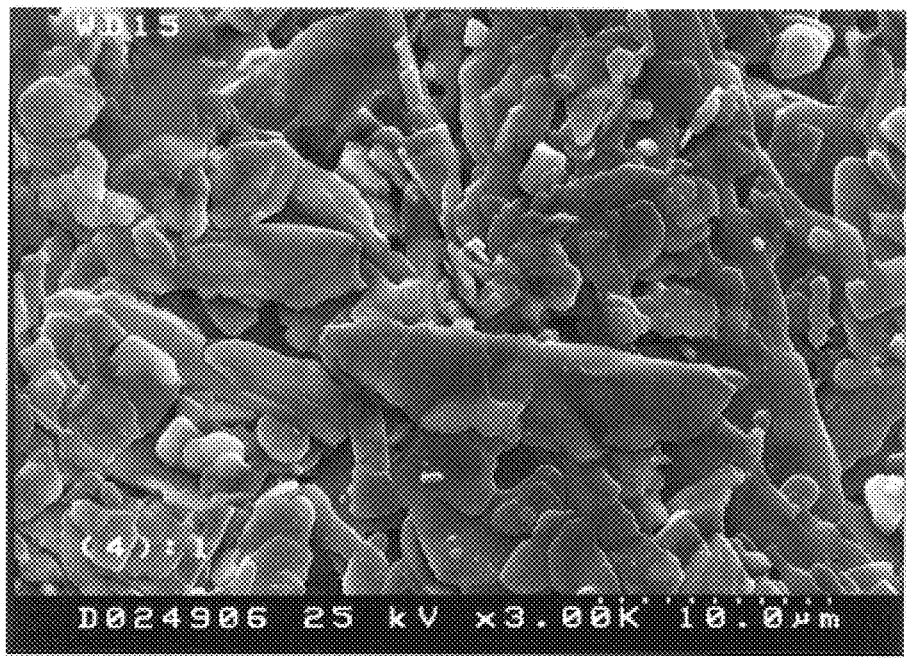
FIG. 6 shows the surface of a thick film in sample No. 6 in Table 1.
Figure 7:
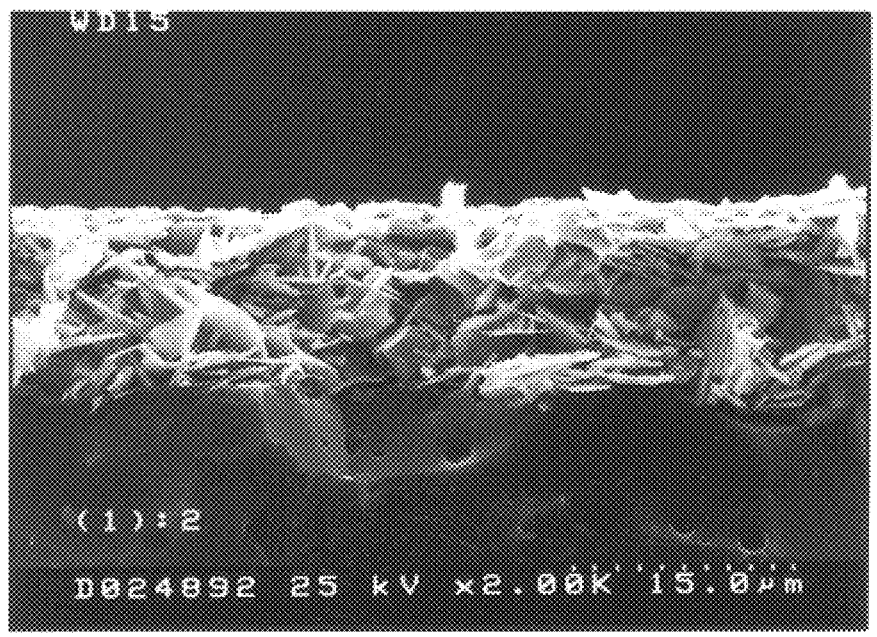
FIG. 7 shows a sectional view of a thick film in sample No. 3 in Table 1.
Figure 8:
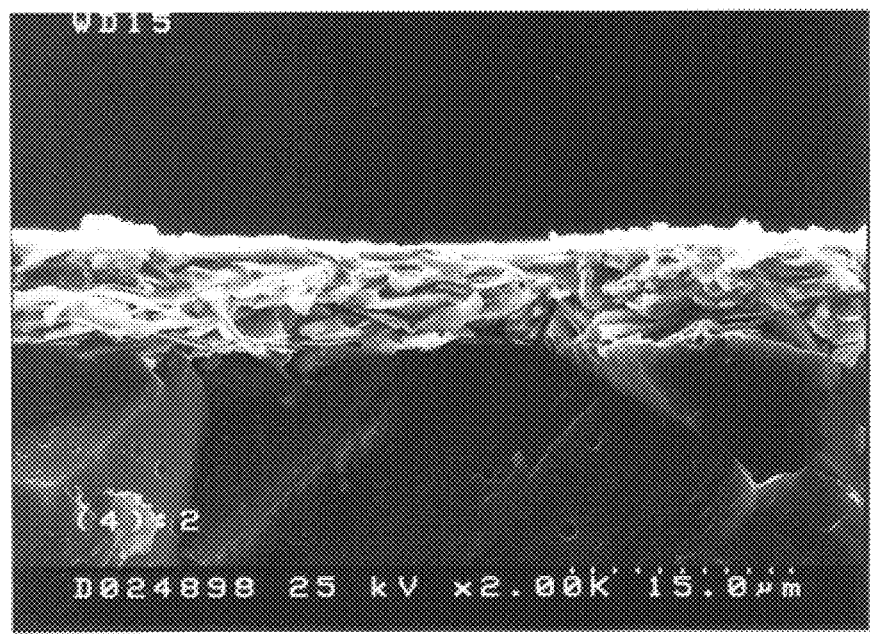
FIG. 8 shows a sectional view of a thick film in sample No. 6 in Table 1.

With respect to thick films formed under the conditions of sample Nos. 3 and 6, FIGS. 3 and 4 show the surface states of the thick films formed and FIGS. 5 and 6 are sectional views of the thick films formed. As is obvious from Table 1, with respect to the thick film of sample No. 3, first firing only was performed at a temperature of 850° C. for 250 hours. With respect to the thick film of sample No. 6, first firing was performed at a temperature of 850° C. for 50 hours, and then, three cycles were performed, each cycle consisting of firing at 850° C. for 50 hours and CIP at a pressure of 2,000 kg/cm$^2$.

As is clear from Table 1, in sample Nos. 1 to 3 (in which CIP was not performed), the resultant thick films have large surface roughness Ra and also have large values of surface resistance Rs. In contrast, in sample Nos. 4 to 7 (in which CIP was performed), the surface roughness Ra of the resultant thick films is decreased, and the values of surface resistance Rs are also decreased. With respect to the thick film of sample No. 4 in which one cycle of CIP and firing was performed, although the surface resistance Rs at an absolute temperature of 70° K has a large value, the surface resistance Rs at an absolute temperature of 20° K has a smaller value than that of thick films of sample Nos. 1 to 3. With respect to the thick films of sample Nos. 5 and 6 in which a plurality of cycles of CIP and firing were performed, the surface roughness Ra is decreased and the surface resistance Rs is also decreased in comparison with thick films of sample Nos. 4 and 7 in which only one cycle was performed.

From FIGS. 3 to 6, it is also clear that the surface state of sample No. 6 is better than that of sample 3. As described above, by repeating CIP and firing a plurality of times, the surface state and the grain orientation of a superconducting thick film are improved, enabling reduction in surface resistance.

In accordance with the present invention, by forming a thick film composed of a superconducting material on a substrate, and after firing, by performing cold isostatic pressing (CIP) and firing, a satisfactory surface state of the thick film can be achieved and surface resistance can be reduced. Therefore, if a superconducting thick film obtained as described above is used for a dielectric resonator, a resonator having a large unloaded Q can be obtained. Additionally, since the thick film can be formed by screen-printing or the like, there will be no difficulties which might occur in a thin film formation, and production costs are low, and also, large areas can be formed easily.

While the invention has been particularly shown and described with reference to preferred embodiments thereof, it will be understood by those skilled in the art that the forgoing and other changes in form and details may be made therein without departing from the spirit of the invention.

What is claimed is:

1. A method for producing an oxide superconducting thick film, comprising the steps of:
   (a) providing a substrate having a thick layer comprising an oxide superconducting material on at least one surface thereof;
   (b) firing the thick layer;
   (c) subjecting the fired thick layer to cold isostatic pressing at a pressure of at least about 1000 kg/cm$^2$;
   (d) refiring the thick layer subjected to cold isostatic pressing; and
   (E) repeating steps (c) and (d) at least once,
wherein the cold isostatic pressing is performed using a jig plate and a sheet having a release agent on a surface thereof interposed between the thick layer and the jig plate, wherein the release agent surface faces the thick layer.

2. A method for producing an oxide superconducting thick film according to claim 1, wherein the thick layer comprises a Bi 2223 phase.

3. A method for producing an oxide superconducting thick film according to claim 2, wherein the substrate is a dielectric substrate.

4. A method for producing an oxide superconducting thick film according to claim 3, wherein the dielectric substrate is selected from the group consisting of an MgO substrate, a Ba(Sn, Mg, Ta)$O_3$ substrate, and a Ba(Mg, Sb, Ta)$O_3$ substrate.

5. A method for producing an oxide superconducting thick film according to claim 3, wherein the dielectric substrate has a thick layer of superconducting material on two opposing surfaces thereof.

6. A method for producing an oxide superconducting thick film according to claim 2, wherein the substrate is an Ag substrate.

7. A method for producing an oxide superconducting thick film comprising the steps of:
   (a) providing a substrate having a thick layer comprising an oxide superconducting material on at least one surface thereof;
   (b) firing the thick layer;
   (c) subjecting the fired thick layer to cold isostatic pressing; and
   (d) refiring the thick layer subjected to cold isostatic pressings,
wherein the cold isostatic pressing is performed using a jig plate and a sheet having a release agent on a surface thereof interposed between the thick layer and the jig plate, wherein the release agent surface faces the thick layer.

8. A method for producing an oxide superconducting thick film according to claim 7, wherein the thick layer comprises a Bi 2223 phase.

9. A method for producing an oxide superconducting thick film according to claim 7, wherein the substrate is a dielectric substrate.

10. A method for producing an oxide superconducting thick film according to claim 7, wherein the dielectric substrate has a thick layer of superconducting material on two opposing surfaces thereof.

11. A method for producing an oxide superconducting thick film according to claim 10, wherein the substrate is a dielectric substrate.

12. A method for producing an oxide superconducting thick film according to claim 11, wherein the thick layer comprises a Bi 2223 phase.

13. A method for producing an oxide superconducting thick film according to claim 7, wherein the substrate is an Ag substrate.

14. A method for producing an oxide superconducting thick film according to claim 13, wherein the thick layer comprises a Bi 2223 phase.

* * * * *